United States Patent [19]
Yamashita

[11] Patent Number: 5,856,754
[45] Date of Patent: Jan. 5, 1999

[54] SEMICONDUCTOR INTEGRATED CIRCUIT WITH PARALLEL/SERIAL/PARALLEL CONVERSION

[75] Inventor: Kyoji Yamashita, Osaka, Japan

[73] Assignee: Matsushita Electric Industrial Co., Ltd., Kadoma, Japan

[21] Appl. No.: 763,801

[22] Filed: Dec. 11, 1996

[30] Foreign Application Priority Data

Jan. 16, 1996 [JP] Japan ................................ 8-004569

[51] Int. Cl.⁶ .............................................. H03K 17/62
[52] U.S. Cl. .......................... 327/407; 327/408; 327/415; 327/416
[58] Field of Search .................................. 326/105, 106, 326/107, 108; 327/407, 408, 409, 410, 411, 412, 413, 415, 416, 417; 341/100, 101; 370/535, 537, 542; 375/354, 365, 368

[56] References Cited

U.S. PATENT DOCUMENTS 5,526,360  6/1996  Kraft ....................................... 327/407

OTHER PUBLICATIONS

J. Paraszczak et al., "High performance dielectrics and processes for ULSI interconnection technologies", IEDM 93, pp. 261–264, 1993.

M. Bohr et al., "A High Performance 0.35 um Logic Technology for 3.3V and 2.5V Operation", IEDM 94, pp. 273–276, 1994.

*Primary Examiner*—Kenneth B. Wells
*Assistant Examiner*—Jeffrey Zweizig
*Attorney, Agent, or Firm*—Renner, Otto, Boisselle & Sklar, P.L.L.

[57] ABSTRACT

The semiconductor integrated circuit of this invention includes: a first converter for converting a plurality of input data signals into a composite serial data signal and outputting the composite serial data signal; a second converter for receiving the composite serial data signal via a data signal wiring and converting the composite serial data signal into a plurality of output data signals; and a clock signal supply section for supplying a clock signal for synchronizing an operation of the first converter and an operation of the second converter, wherein the clock signal is input into the first converter and the second converter via a clock signal wiring, the data signal wiring imparts a time delay to the composite serial data signal input into the second converter, and the clock signal wiring imparts a time delay to the clock signal input into the second converter.

14 Claims, 15 Drawing Sheets

SEMICONDUCTOR INTEGRATED CIRCUIT WITH PARALLEL/SERIAL/PARALLEL CONVERSION

BACKGROUND OF THE INVENTION

1. Field of the Invention

The present invention relates to a semiconductor integrated circuit, and in particular to a semiconductor integrated circuit with less interconnect delay time so that high speed operation is realized when the integration level is increased.

2. Description of the Related Art

In the fabrication of very large scale integrated circuits (VLSIs), multilayer wirings are required to be miniaturized along with the scaling of the circuits in response to the request for a higher integration level of the circuits. However, as the wirings are miniaturized, the interconnect delay increases. The increase of the interconnect delay makes it difficult to maintain the circuit performance according to the trend of the scaling.

The interconnect delay increases when the length of a wiring between the input and output thereof increases. FIG. 14 shows a conventional bus wiring arrangement (including n bus wirings in FIG. 14). Referring to FIG. 14, bus input signals VIN0(i) (i=1 to n) pass through respective bus wirings W0(i) and are output as bus output signals VOUT0(i). Drivers D0(i) drive the respective bus wirings W0(i).

FIG. 15 is a structural sectional view of the bus wirings W0(i) taken along line A—A of FIG. 14. Referring to FIG. 15, the wiring layer of the bus wirings W0(i) is formed over a wiring layer 151 having an interlayer insulating film 152 therebetween. The reference codes L0, S0, T0, and H0 denote the width of the bus wirings W0(i), the spacing between the bus wirings W0(i), the thickness of the bus wirings W0(i), and the thickness of the interlayer insulating film 152 between the bus wirings W0(i) and the wiring layer 151, respectively.

In order to miniaturize the wirings, all of the n bus wirings, for example, must be scaled down, i.e., narrowed. This increases the wiring resistance and thereby the interconnect delay to such a degree that the interconnect delay cannot be neglected.

Hereinbelow, the degree to which the miniaturization of the wirings actually increases the interconnect delay is roughly estimated. In the following estimation, assume that the scaling factor is K, i.e., the design rule is reduced to 1/K every generation.

As a semiconductor integrated circuit is miniaturized, the chip area of the LSI is reduced. In recent years, however, some elements with different functions which were used to be formed on separate LSI chips tend to be integrated onto one LSI. This is because, in an inter-chip signal transmission (where a signal is output outside a chip and received on another chip), signal delay is larger by one or two orders of magnitude than an inner-chip signal transmission. Accordingly, the chip area of one LSI tends to increase. In this estimation, therefore, it is assumed that the chip area is fixed, i.e., the wiring length is fixed.

When the width, the spacing, and the thickness of the wirings and the thickness of the interlayer film are scaled down to 1/K, the wiring capacitance is maintained, but the wiring resistance is increased by a factor $K^2$, thereby increasing the so-called wiring RC delay by the factor $K^2$. While the gate delay is reduced to 1/K with the scaling, the wiring RC delay is relatively increased at a rate of $K^3$ times when the delay of the entire wirings scaled down to 1/K is used as the reference.

The following methods have been proposed to reduce the increased interconnect delay due to wiring miniaturization.

(1) The wiring material is changed from aluminum (Al) to copper (Cu) to reduce the wiring resistance, and the material of the interlayer film is changed from $SiO_2$ to SiOF with a low dielectric constant to reduce the wiring capacitance. This method is described, for example, in IEEE, 1993, IEDM Technical Digest, pp. 261–264.

(2) A hierarchical wiring structure is adopted, where the width and the thickness are scaled down for the wirings which are shortened during the miniaturization, while they are increased for the wirings which are not shortened, but rather lengthened during the miniaturization. This method is described, for example, in IEEE, 1994, IEDM Technical Digest, pp. 273–276.

The above methods, however, are not sufficient for MOS type integrated circuits which are fabricated based on the design rule of deep submicrons for the following reasons.

As for method (1) of changing the wiring material and the material of the interlayer film, the reduction of the wiring resistance obtained by changing the wiring material from Al to Cu is only about 37%, and the reduction of the wiring capacitance obtained by using a material with a low dielectric constant is only about 25%. These reductions are too small to counteract the increased interconnect delay due to the scaling.

As for method (2) of adopting a hierarchical wiring structure, the size of the miniaturized wirings and the size of the non-miniaturized wirings become unbalanced, thereby increasing the area of the non-miniaturized wirings. As a result, high integration is not possible.

SUMMARY OF THE INVENTION

The semiconductor integrated circuit of this invention includes: a first converter for converting a plurality of input data signals into a composite serial data signal and outputting the composite serial data signal; a second converter for receiving the composite serial data signal via a data signal wiring and converting the composite serial data signal into a plurality of output data signals; and a clock signal supply section for supplying a clock signal for synchronizing an operation of the first converter and an operation of the second converter, wherein the clock signal is input into the first converter and the second converter via a clock signal wiring, the data signal wiring imparts a time delay to the composite serial data signal input into the second converter, and the clock signal wiring imparts a time delay to the clock signal input into the second converter.

In one embodiment of the invention, the first converter comprises: first to n-th input transfer gates each for receiving one of the plurality of input data signals, for allowing the input data signal to pass therethrough for a predetermined period based on a gate signal, and for outputting a transmitted input data signal; and a plurality of input delay elements each operatively coupled to a corresponding one of the plurality of input transfer gates for delaying for a predetermined time period the gate signal input into each of the input transfer gates, wherein the clock signal is input into the first input transfer gate as the gate signal, and the gate signal at the i-th (i=1 to n−1) input transfer gate is input into the (i+1)th input transfer gate via one of the plurality of input delay elements as the gate signal, and the second converter comprises: first to n-th output transfer gates each for receiving the composite serial data signal, for allowing the composite serial data signal to pass therethrough for a predetermined period based on the gate signal, and for outputting a transmitted output data signal; and a plurality of output delay elements each operatively coupled to a corresponding one of the plurality of output transfer gates for delaying for a predetermined time period the gate signal input into each of the output transfer gates, wherein the clock signal is input into the first output transfer gate as the gate signal, and the gate signal at the i-th (i=1 to n−1) output transfer gate is input into the (i+1)th output transfer gate via one of the plurality of output delay elements as the gate signal.

In another embodiment of the invention, the delay time of each of the plurality of input delay elements and the delay time of each of the plurality of output delay elements corresponding to each of the plurality of input delay elements are substantially equal.

In still another embodiment of the invention, a delay time generated by the data signal wiring and a delay time generated by the clock signal wiring are substantially equal.

In still another embodiment of the invention, the delay time of each of the plurality of input delay elements, the delay time of each of the plurality of output delay elements corresponding to each of the plurality of input delay elements, a delay time generated by the data signal wiring, and a delay time generated by the clock signal wiring are substantially equal.

In still another embodiment of the invention, the number of the plurality of input data signals is n (wherein n is a natural number), and a wiring width and a wiring spacing for the data signal wiring and the clock signal wiring are n/2 times a wiring width and a wiring spacing for the input data signals.

In still another embodiment of the invention, the number of the plurality of input data signals is n (wherein n is a natural number), the data signal wiring and the clock signal wiring overlie an interlayer film which overlies other wiring layer, and a wiring width, a wiring spacing, a wiring thickness, and an interlayer film thickness for the data signal wiring and the clock signal wiring are n/2 times a wiring width, a wiring spacing, a wiring thickness, and an interlayer film thickness for the input data signals.

Alternatively, the semiconductor integrated circuit of this invention includes: a plurality of first converters; a plurality of second-converters; and a clock signal supply section for supplying a clock signal for synchronizing an operation of the plurality of first converters and an operation of the plurality of second converters, wherein each of the plurality of first converters converts a plurality of input data signals into a composite serial data signal and outputs the composite serial data signal, each of the plurality of second converters receives the composite serial data signal via a data signal wiring and converts the composite serial data signal into a plurality of output data signals, the clock signal is input into each of the plurality of first converters and the plurality of second converters via a clock signal wiring, each of the data signal wirings imparts a time delay to the composite serial data signal input into each of the plurality of second converters, and the clock signal wiring imports a time delay to the clock signal input into each of the plurality of second converters.

In one embodiment of the invention, each of the plurality of first converters comprises: first to n-th input transfer gates each for receiving one of the plurality of input data signals, for allowing the input data signal to pass therethrough for a predetermined period based on a gate signal, and for outputting a transmitted input data signal; and a plurality of input delay elements each operatively coupled to a corresponding one of the plurality of input transfer gates for delaying for a predetermined time period the gate signal input into each of the input transfer gates, wherein the clock signal is input into the first input transfer gate as the gate signal, and the gate signal at the i-th (i=1 to n−1) input transfer gate is input into the (i+1)th input transfer gate via one of the plurality of input delay elements as the gate signal, and each of the plurality of second converters comprises: first to n-th output transfer gates each for receiving the composite serial data signal, for allowing the composite serial data signal to pass therethrough for a predetermined period based on the gate signal, and for outputting a transmitted output data signal; and a plurality of output delay elements each operatively coupled to a corresponding one of the plurality of output transfer gates for delaying for a predetermined time period the gate signal input into each of the output transfer gate, wherein the clock signal is input into the first output transfer gate as the gate signal, and the gate signal at the i-th (i=1 to n−1) output transfer gate is input into the (i+1)th output transfer gate via one of the plurality of output delay elements as the gate signal.

In another embodiment of the invention, the delay time of each of the plurality of input delay elements and the delay time of each of the plurality of output delay elements corresponding to each of the plurality of input delay elements are substantially equal.

In still another embodiment of the invention, a delay time generated by each of the data signal wirings and a delay time generated by the clock signal wiring are substantially equal.

In still another embodiment of the invention, the delay time of each of the plurality of input delay elements, the delay time of each of the plurality of output delay elements corresponding to each of the plurality of input delay elements, a delay time generated by each of the data signal wirings, and a delay time generated by the clock signal wiring are substantially equal.

In still another embodiment of the invention, the number of the plurality of input data signals is n×m (wherein n and m are natural numbers, wherein m represents the number of first and second converters and wherein n represents the number of input data signals input to each of the plurality of first converters), and a wiring width and a wiring spacing for the data signal wirings and the clock signal wiring are (n×m)/(m+1) times a wiring width and a wiring spacing for the input data signals.

In still another embodiment of the invention, the number of the plurality of input data signals is n×m (wherein n and m are natural numbers, wherein m represents the number of first and second converters and wherein n represents the number of input data signals input to each of the plurality of first converters), the data signal wiring and the clock signal wiring overlie an interlayer film which overlies other wiring layer, and a wiring width, a wiring spacing, a wiring thickness, and an interlayer film thickness for the data signal wirings and the clock signal wiring are (n×m)/(m+1) times a wiring width, a wiring spacing, a wiring thickness, and an interlayer film thickness for the input data signals.

Thus, the invention described herein makes possible the advantage of providing a semiconductor integrated circuit where the interconnect delay is reduced in a process under the design rule of deep submicrons to obtain a higher integration level and realize high speed operation.

These and other advantages of the present invention will become apparent to those skilled in the art upon reading and understanding the following detailed description with reference to the accompanying figures.

DESCRIPTION OF THE PREFERRED EMBODIMENTS

The present invention will be described by way of examples with reference to the accompanying drawings.

(EXAMPLE 1)

Figure 1:
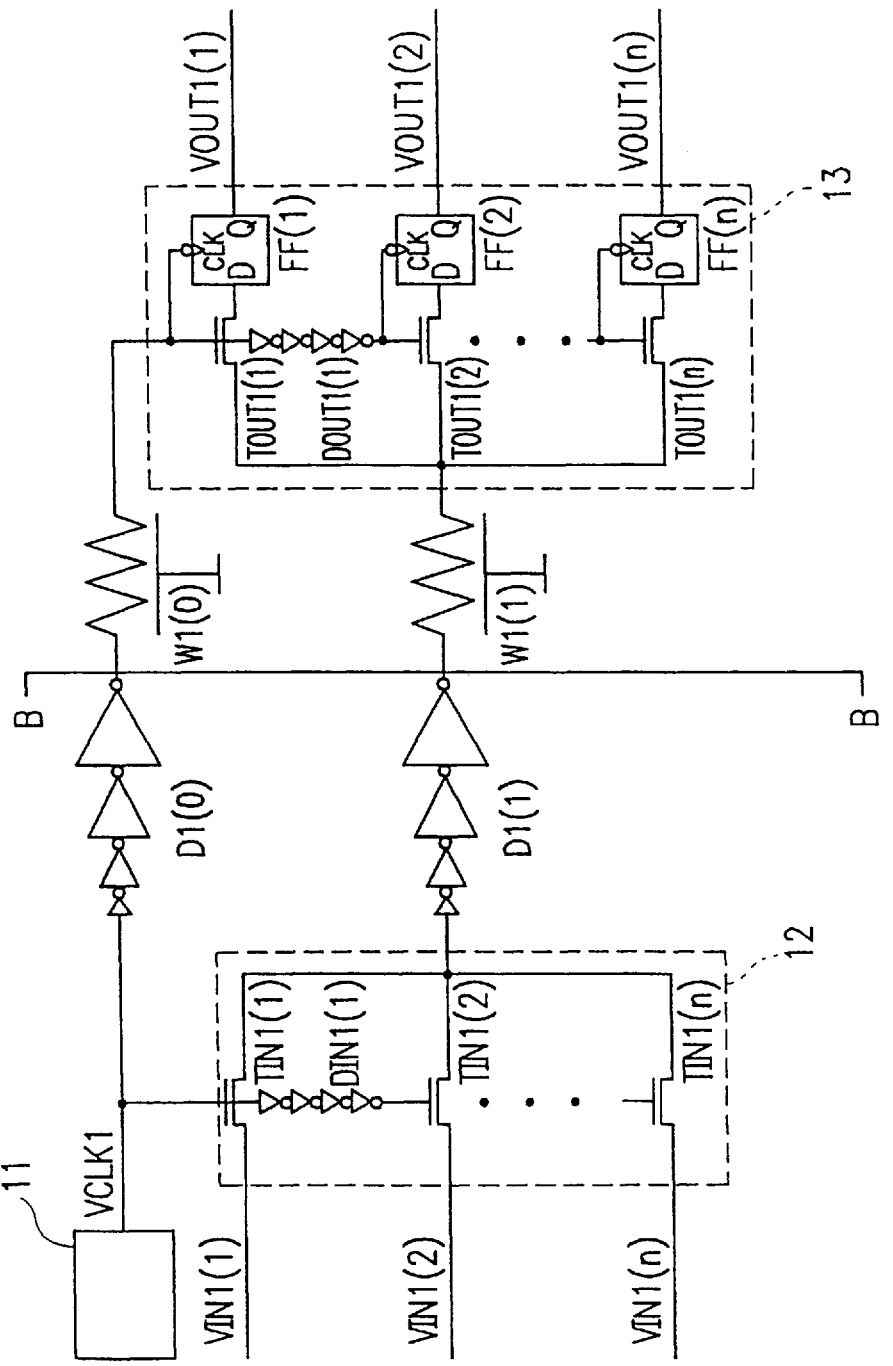
FIG. 1 is a circuit diagram of a semiconductor integrated circuit of Example 1 according to the present invention.

FIG. 1 is a circuit diagram of a semiconductor integrated circuit of Example 1 according to the present invention.

Referring FIG. 1, n bus input signals VIN1(i) (i=1 to n, wherein i is a bus number) are input into corresponding n transfer gates TIN1(i) which control the coupling of the bus input signals VIN1(i) with a main wiring W1(1).

A clock signal supply section 11 outputs a clock signal VCLK1 into a first transfer gate TIN1(1) as a gate signal. The gate signal at the first transfer gate TIN1(1) is then input into a second transfer gate TIN1(2) via a first delay element DIN1(1) as a gate signal. Likewise, the gate signal at a transfer gate TIN1(j) (j=1 to n−1) is input into a transfer gate TIN1(j+1) via a delay element DIN1(j) as a gate signal. The delay element DIN1(j) delays the activation of the transfer gate TIN1(j+1) from the activation of the transfer gate TIN1(j) by a time period T. When the gate signal is active, each of the transfer gates TIN1(i) allows a corresponding input signal VIN1(i) to pass therethrough and be output therefrom as an output signal. The outputs from all the transfer gates TIN1(i) are coupled together to be input into a driver D1(1). The n transfer gates TIN1(i) and the n−1 delay elements DIN1(i) constitute a first converter 12 for converting input parallel signals into a composite serial signal.

The driver D1(1) drives the main wiring W1(1). The main wiring W1(1) is a wiring for data signals which sends the n bus input signals VIN1(i) serially. The composite serial signal output from the driver D1(1) is sent to a second converter 13 via the main wiring W1(1). The second converter 13, which converts the composite serial signal into parallel signals, includes n transfer gates TOUT1(i), n−1 delay elements DOUT1(i), and n flipflops FF(i). The composite serial signal sent to the second converter 13 from the main wiring W1(1) is input into all the transfer gates TOUT1(i) in the second converter 13.

The clock signal VCLK1 is input into a driver D1(0) for driving a clock signal wiring W1(0), and, via the clock signal wiring W1(0), input into a first transfer gate TOUT1(1) in the second converter 13 as a gate signal. The gate signal at the first transfer gate TOUT1(1) is input into a second transfer gate TOUT1(2) via a first delay element DOUT1(1) as a gate signal. Likewise, the gate signal at a transfer gate TOUT1(j) (j=1 to n−1) is input into a transfer gate TOUT1(j+1) via a delay element DOUT1(j) as a gate signal. The delay element DOUT1(j) delays the activation of the transfer gate TOUT1(j+1) from the activation of the transfer gate TOUT1(j) by the time period T. When the gate signal is active, each of the transfer gates TOUT1(i) allows the composite input signal to pass therethrough and be output therefrom as an output signal.

The output signals of the transfer gates TOUT1(i) are output into D inputs of the corresponding flipflops FF(i). The gate signals input into the transfer gates TOUT1(i) are also input into CLK inputs of the flipflops FF(i), so that the flipflops FF(i) latch the output signals of the transfer gates TOUT1(i) on the falling edge of the gate signals and output as bus output signals VOUT1(i).

Figure 4:
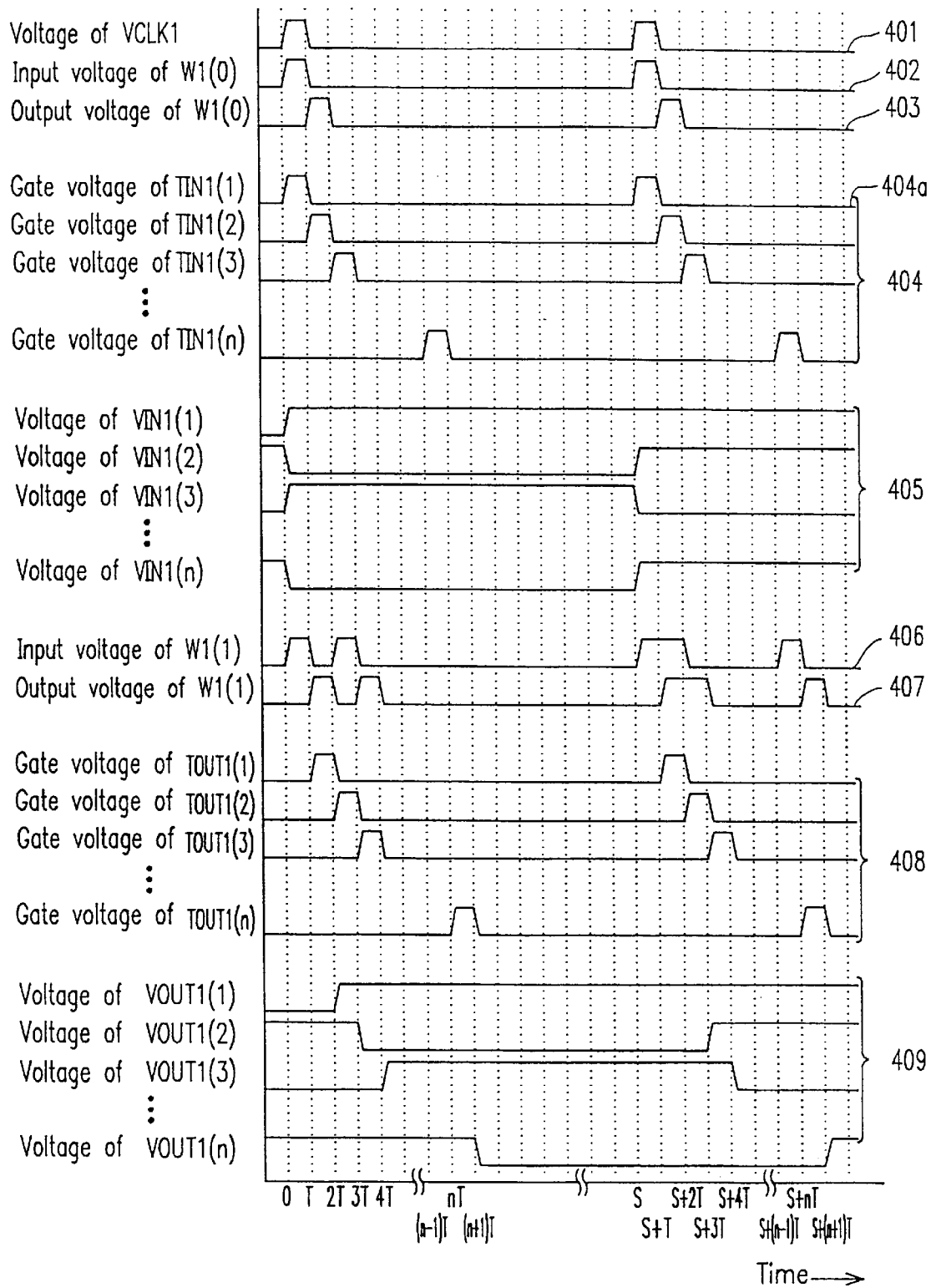
FIG. 4 is a timing diagram of signals used in the semiconductor integrated circuit of Example 1.

The operation of the semiconductor integrated circuit of Example 1 will be described with reference to FIG. 4. FIG. 4 is a timing diagram of signals used in this example. The reference numeral 405 denotes exemplified bus input signals VIN1(i) (i=1 to n). In this timing diagram, a certain time used as the reference by the bus input signals VIN1(i) is set at 0. The clock signal VCLK1 (401) is at a high level (HIGH) during the period between time 0 and T. The time period T is a delay time generated when the main wiring W1(1) is driven. The delay time generated when the clock signal wiring W1(0) is driven, the time during which the clock signal VCLK1 is HIGH, the delay time generated by the delay elements DIN1(j) (j=1 to n−1), and the delay time generated by the delay elements DOUT1(j) are also set to be equal to the time period T. An input signal 402 of the wiring W1(0) and a gate signal 404a at the first transfer gate TIN1(1) have the same timing and waveform as the clock signal VCLK1 (401).

The reference numeral 404 denotes the gate signals at the transfer gates TIN1(i). The gate signal at the transfer gate TIN1(j+1) (j=1 to n−1) is delayed from the gate signal at the transfer gate TIN1(j) by the time period T by the delay element DIN1(j). Thus, the transfer gates TIN1(i) (i=1 to n) are sequentially turned on every time period T, thereby allowing the bus input signals VIN1(i) (405) to sequentially pass therethrough each for the time period T. When the bus input signals VIN1(1), VIN1(2), VIN1(3), . . . , VIN1(n) are HIGH, LOW, HIGH, . . . , LOW, respectively, as shown in FIG. 4, the serial signal (composite input signal) obtained by coupling together the outputs of the transfer gates TIN1(i) should have a waveform changing to HIGH, LOW, HIGH, . . . , LOW at the time period T as shown as an input signal 406 of the main wiring W1(1). Thus, the parallel bus input signals VIN1(i) are converted into the composite serial signal.

An output signal 407 of the main wiring W1(1) is delayed from the input signal 406 thereof by the time period T due to the delay at the driver D1(1) and the main wiring W1(1). An output signal 403 of the clock signal wiring W1(0) is delayed from the input signal 402 thereof by the time period T due to the delay at the driver D1(0) and the clock signal wiring W1(0), and is sent to the first transfer gate TOUT1(1) as a gate signal.

The reference numeral 408 denotes the gate signals at the transfer gates TOUT1(i). The gate signal at the transfer gate TOUT1(j+1) (j=1 to n−1) is delayed from the gate signal at the transfer gate TOUT1(j) by the time period T by the delay element DOUT1(j). Thus, the transfer gates TOUT1(i) (i=1 to n) are sequentially turned on every time period T, allowing the signal output from the main wiring W1(1) to pass therethrough. The bus input signals VIN1(i) which have passed through the transfer gates TIN1(i) then pass through the corresponding transfer gates TOUT1(i) after the time period T. The flipflops FF(i) latch the signals which have passed through the transfer gates TOUT1(i) at the falling edge of the respective gate signal, and output the bus output signals VOUT1(i), as shown by the reference numeral 409 in FIG. 4. Thus, the signals once converted into the composite serial signal are restored as the original parallel signals.

When the system clock period for the entire semiconductor integrated circuit of this example is S, the clock signal VCLK1 becomes HIGH for the time period T every period S, and the above-described operation is repeated.

Figure 3:
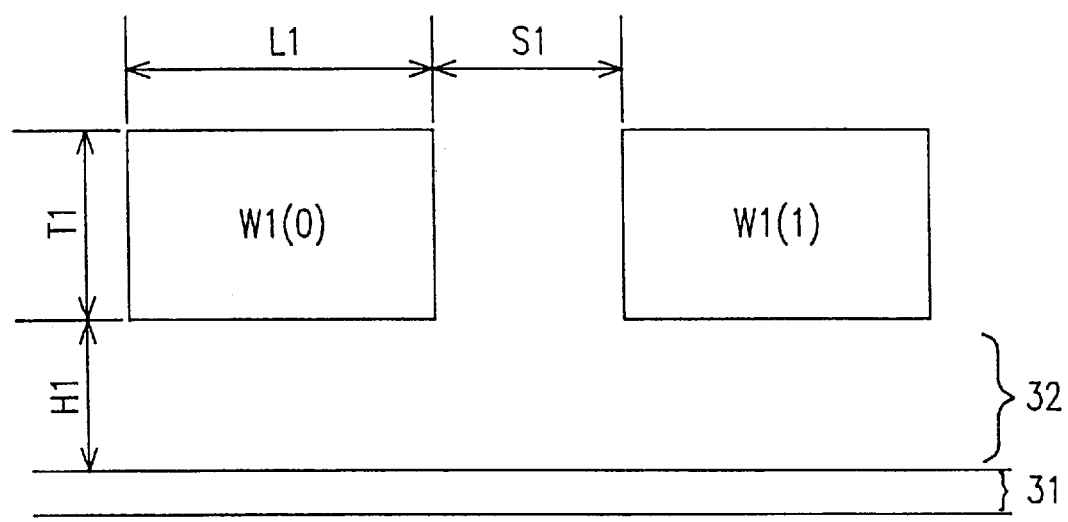
FIG. 3 is a structural sectional view showing a multilayer wiring structure of the semiconductor integrated circuit of Example 1.

FIG. 3 is a structural sectional view taken along line B—B of FIG. 1. Referring to FIG. 3, in Example 1, the size of the main wiring W1(1) for data signal transmission and the clock signal wiring W1(0), i.e., a width L1, a spacing S1, and a thickness T1 of the wirings, and a thickness H1 of an interlayer insulating film 32 separating the wirings W1(0) and W1(1) from a wiring layer 31, can be made larger n/2 times the size of the bus input/output wiring portions. In comparison with the conventional bus wirings W0(1) shown in FIG. 14, where the size of the wirings is uniform from the input through the output thereof, the wiring resistance of the main wiring W1(1) can be reduced to $4/n^2$ times that of the bus wirings W0(i), while the wiring capacitance of the main wiring W1(1) is kept unchanged. Accordingly, the RC delay at the main wiring W1(1) generated when one signal is sent is reduced to $4/n^2$ times that of the bus wirings W0(i). Since n signals are serially sent through the main wiring W1(1) in this example, the total RC delay at the main wiring W1(1) is 4/n times that of the bus wirings W0(i). This indicates that the effect of reducing the delay time of this example is obtained when the number of buses is four or more.

In reality, delays other than (1) the wiring RC delay are generated. They are, for example, (2) a delay required for wiring charging/discharging and (3) a delay at the driver. These delays are also described in comparison with the conventional case shown in FIG. 14 where signals are sent through n bus wirings.

Figure 14:
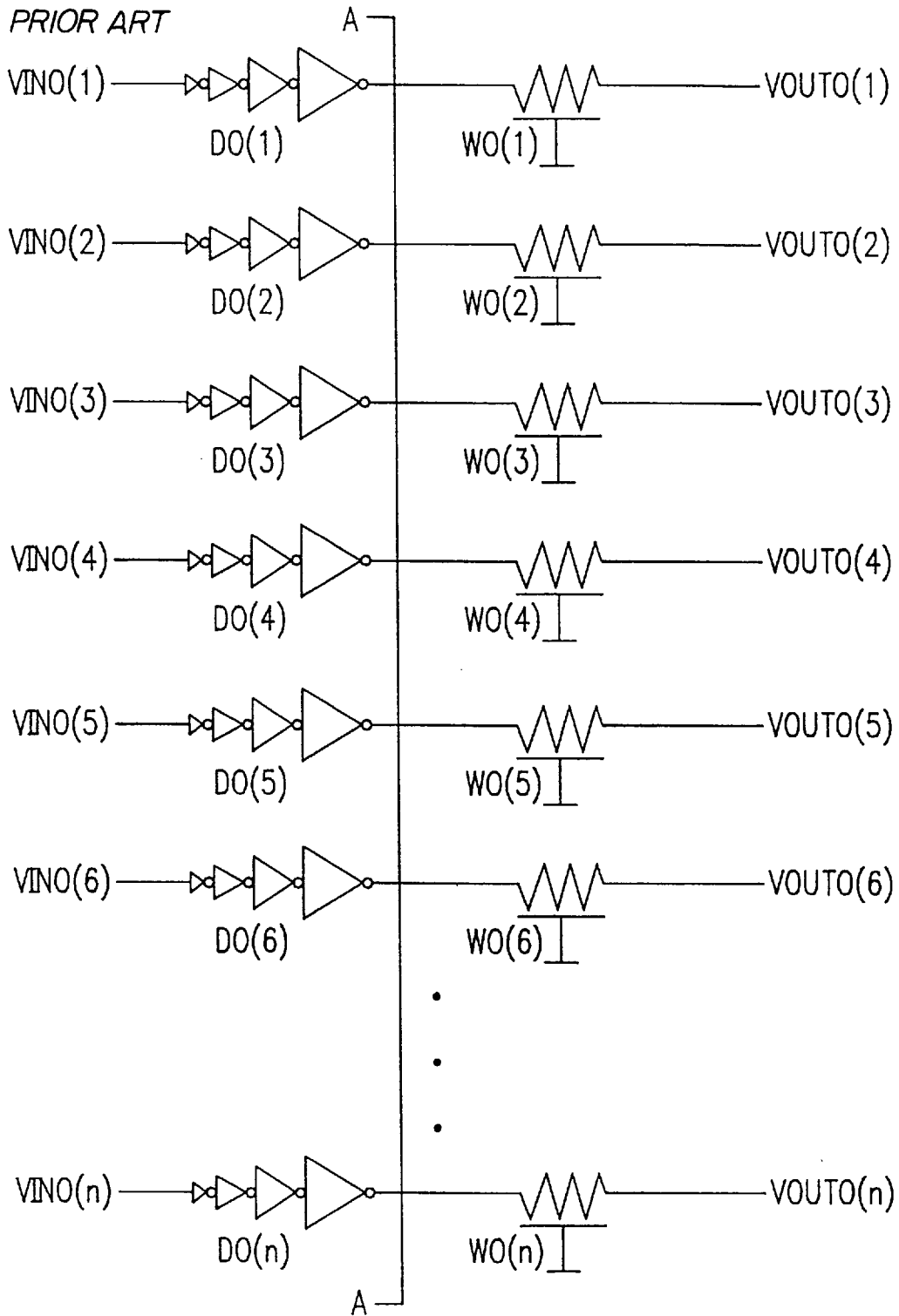
FIG. 14 is a circuit diagram of bus signal wirings of a conventional semiconductor integrated circuit.
Figure 15:
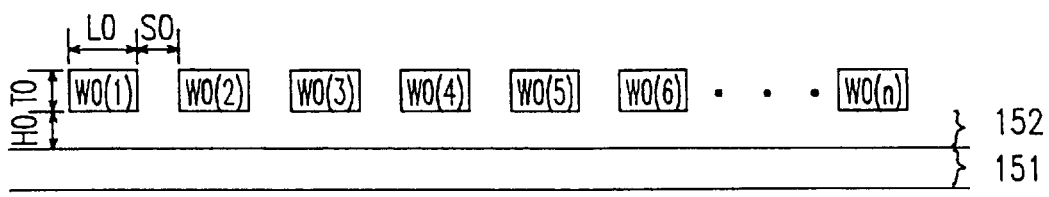
FIG. 15 is a structural sectional view showing a multilayer wiring structure of the conventional semiconductor integrated circuit of FIG. 14.

As for (2) above, assuming that the total area of the drivers D1(0) and D1(1) in this example is equal to the total area of the n drivers D0(i) shown in FIG. 14, the gate width of the driver D1(0) or D1(1) can be n/2 times that of each of the drivers D0(i). Accordingly, the delay time required for charging/discharging the wiring W1(1) when one signal is sent is 2/n times that required for charging/discharging each of the wirings W0(i). In this example, since n signals are transmitted serially, the delay time required for charging/discharging the wiring W1(1) is 2 times longer.

As for (3) above, the delay time at the driver D1(1) when one signal is sent is the same as that at the drivers D0(i). When n signals are transmitted serially as in this example, the delay time at the driver D1(1) is n times that at the drivers D0(i).

In consideration of the above, the semiconductor integrated circuit of this example will be effective in reducing the delay time if delay (1) is major while delays (2) and (3) are minor in the total delay time. Hereinbelow, the delay time is calculated by way of trial using presumed data under the layout design rule of 0.1 µm. Assume that the circuit includes eight buses with a interconnect delay of totalling 1 ns, including (1) a wiring RC delay of 0.96 ns, (2) a delay required for wiring charging/discharging of 0.03 ns, and (3) a delay at the driver of 0.01 ns. In the circuit configuration of this example, the delay time of the entire collective wiring is:

$$0.96 \text{ ns} \times 4/8 + 0.03 \text{ ns} \times 2 + 0.01 \text{ ns} \times 8 = 0.62 \text{ ns}$$

which is smaller than the delay time (1 ns) generated in the conventional circuit configuration shown in FIG. 14 by 38%.

As described above, in Example 1, a plurality of signals received in parallel are transmitted serially through a main wiring with a large sectional area. This largely reduces the wiring RC delay which will otherwise cause a critical problem during the miniaturization of the semiconductor integrated circuit.

The delay time generated by the main wiring W1(1), the delay time generated by the clock signal wiring W1(0), the time during which the clock signal VCLK1 is HIGH, the delay time of the delay elements DIN1(j) (j=1 to n−1), and the delay time of the delay elements DOUT1(j) are set to be substantially equal. With this setting, the parallel signals can be converted into the composite serial signal and then restored as the parallel signals efficiently.

(EXAMPLE 2)

Figure 2:
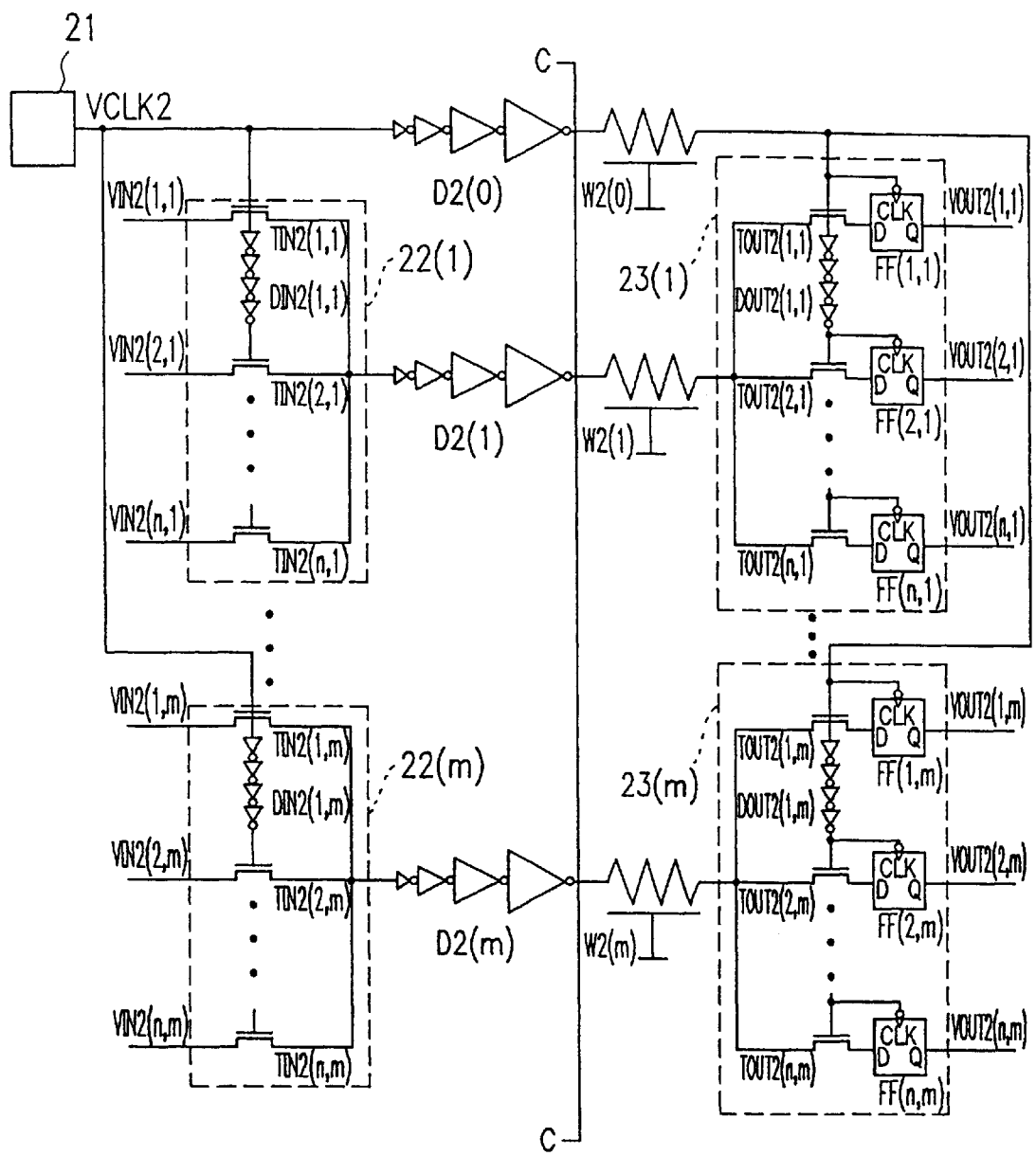
FIG. 2 is a circuit diagram of a semiconductor integrated circuit of Example 2 according to the present invention.

FIG. 2 is a circuit diagram of a semiconductor integrated circuit of Example 2 according to the present invention. The semiconductor integrated circuit of Example 2 includes m groups of n buses. Each group consisting of n buses corresponds to the circuit configuration of Example 1 shown in FIG. 1.

Referring to FIG. 2, N (=n×m) bus input signals VIN2(i,j) (i=1 to n, j=1 to m; wherein i is a bus number in a group, and j is a bus group number) are input into corresponding N transfer gates TIN2(i,j) which control the coupling of the bus input signals VIN2(i,j) with corresponding main wirings W2(j).

A clock signal supply section 21 outputs a clock signal VCLK2 into a first transfer gate TIN2(1,j) (j=1 to m) of each bus group as a gate signal. The gate signal of the first transfer gate TIN2(1,j) of each bus group is then input into a second transfer gate TIN2(2,j) via a first delay element DIN2(1,j) of each bus group as a gate signal. Likewise, the gate signal of a transfer gate TIN2(k,j) (k=1 to n−1, j=1 to m) is input into a transfer gate TIN2(k+1,j) via a delay element DIN2(k,j) as a gate signal. The delay element DIN2(k,j) delays the activation of the transfer gate TIN2(k+1,j) from the activation of the transfer gate TIN2(k,j) by a time period T. When the gate signal is active, each of the transfer gates TIN2(i,j) allows an input signal to pass therethrough and be output therefrom as an output signal. The outputs from all the transfer gates TIN2(i,j) of each bus group are coupled together to be input into a driver D2(j). A first converter 22(j) (j=1 to m) for each group of the bus input signals VIN2(i,j) includes n transfer gates TIN2(i,j) and n−1 delay elements DIN2(i,j). The first converters 22(j) convert input parallel signals into composite serial signals.

The drivers D2(j) drive respective main wirings W2(j) (j=1 to m) for data signal transmission. Each of the main wirings W2(j) serially transmits the n bus input signals VIN2(i,j) of each bus group. The composite serial signal output from each driver D2(j) is input into a corresponding second converter 23(j) (j=1 to m) via the corresponding main wiring W2(j). Each of the second converters 23(j), which convert the composite serial signals from the corresponding first converter 22(j) into parallel signals, includes n transfer gates TOUT2(i,j), n−1 delay elements DOUT2(i,j), and n flipflops FF(i,j). The composite serial signal sent to each second converter 23(j) from the corresponding main wiring W2(j) is input into all the transfer gates TOUT2(i,j) in the second converter 23(j).

The clock signal VCLK2 is input into a driver D2(0) for driving a clock signal wiring W2(0), and, via the clock signal wiring W2(0), input into a first transfer gate TOUT2 (1,j) in each second converter 23(j) as a gate signal. The gate signal at the first transfer gate TOUT2(1,j) is input into a second transfer gate TOUT2(2,j) via a first delay element DOUT2(1,j) of each second converter 23(j) as a gate signal. Likewise, the gate signal of a transfer gate TOUT2(k,j) (k=1 to n−1, j=1 to m) is input into a transfer gate TOUT2(k+1,j) via a delay element DOUT2(k,j) as a gate signal. The delay element DOUT2(k,j) delays the activation of the transfer gate TOUT2(k+1,j) from the activation of the transfer gate TOUT2(k,j) by the time period T. When the gate signal is active, each of the transfer gates TOUT2(i,j) allows an input signal to pass therethrough and be output therefrom as an output signal.

The output signals of the transfer gates TOUT2(i,j) are input into D inputs of the corresponding flipflops FF(i,j). The gate signals input into the transfer gates TOUT2(i,j) are also input into CLK inputs of the flipflops FF(i,j), so that the flipflops FF(i,j) latch the output signals of the transfer gates TOUT2(i,j) at the falling edge of the gate signals and output as bus output signals VOUT2(i,j).

Figure 6:
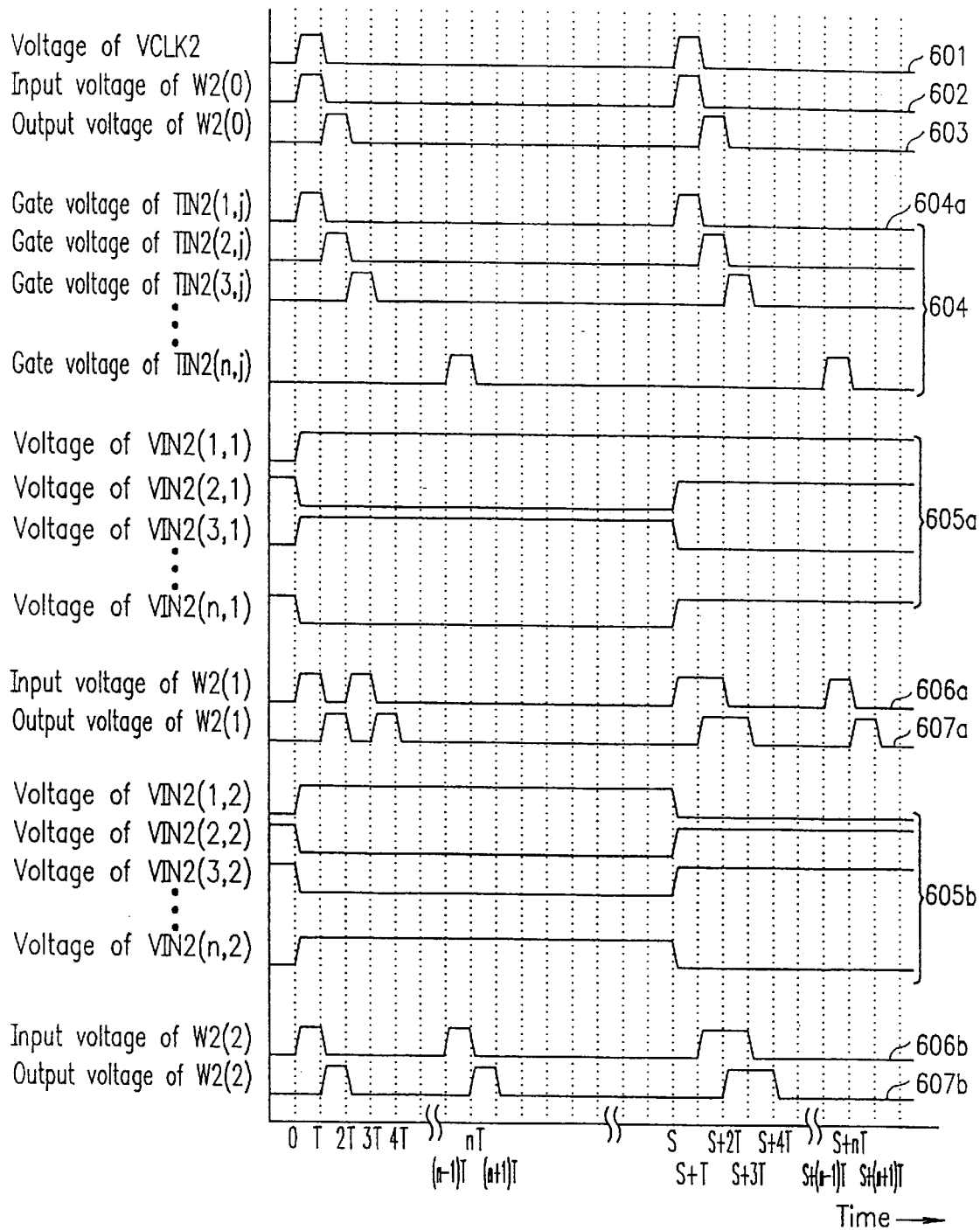
FIG. 6 is a timing diagram of signals used in the semiconductor integrated circuit of Example 2, showing the conversion of parallel signals into a composite serial signal.
Figure 7:
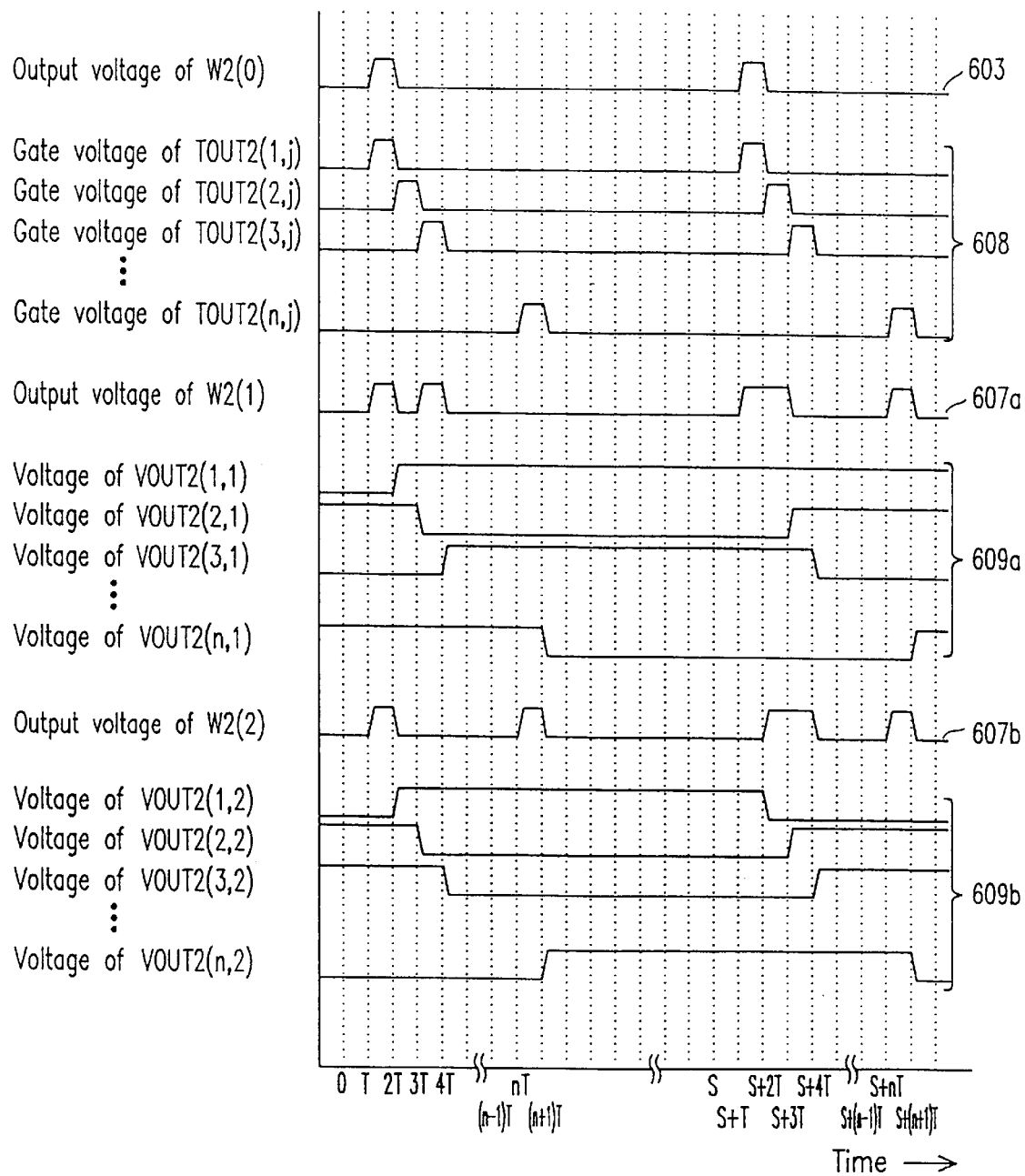
FIG. 7 is a timing diagram of signals used in the semiconductor integrated circuit of Example 2, showing the conversion of the composite serial signal into parallel signals.

The operation of the semiconductor integrated circuit of Example 2 will be described with reference to FIGS. 6 and 7. FIGS. 6 and 7 are timing diagrams of signals used in the semiconductor integrated circuit of this example. Two bus groups from the total m bus groups are representatively shown in these timing diagrams. The reference numerals 605a and 605b show examples of the bus input signals VIN2(i,1) (i=1 to n) and VIN2(i,2), respectively. In these timing diagrams, a certain time used as the reference by the bus input signals VIN2(i,1) and VIN2(i,2) is set at 0, as in Example 1. The clock signal VCLK2 (601) is in a high level (HIGH) during the period between time 0 and T. The time period T corresponds to the delay time generated by the main wirings W2(j) (j=1 to m). The delay time generated by the clock signal wiring W2(0), the time during which the clock signal VCLK2 is HIGH, the delay time generated by the delay elements DIN2(k,j) (k=1 to n−1, j=1 to m), and the delay time generated by the delay elements DOUT2(k,j) are also set to be equal to the time period T. An input signal 602 of the wiring W2(0) and a gate signal 604a at the first transfer gates TIN2(1,j) have the same timing and waveform as the clock signal VCLK2 (601).

The reference numeral 604 denotes the gate signals at the transfer gates TIN2(i,j). The gate signal at the transfer gate TIN2(k+1,j) (k=1 to n−i) of each bus group is delayed from the gate signal at the transfer gate TIN2(k,j) by the time period T by the delay element DIN2(k,j). Thus, for the first bus group, for example, the transfer gates TIN2(i,1) (i=1 to n) are sequentially turned on every time period T, allowing the bus input signals VIN2(i,1) to pass therethrough each for the time period T. When the bus input signals VIN2(1,1), VIN2(2,1), VIN2(3,1), . . . , VIN2(n,1) are HIGH, LOW, HIGH, . . . , LOW, respectively, as shown in FIG. 6, the signal obtained by coupling together the outputs of the transfer gates TIN2(i,1) should have a waveform changing to HIGH, LOW, HIGH, . . . , LOW at the time period T as shown as an input signal 606a of the main wiring W2(1). This is also applicable for the other bus groups. The bus input signals VIN2(i,2) are converted into a composite serial signal as shown as an input signal 606b of the main wiring W2(2). Thus, the m groups of the parallel bus input signals VIN2(i,j) are converted into m composite serial signals.

An output signal 607a of the main wiring W2(1) is delayed from the input signal 606a thereof by the time period T due to the delay at the driver D2(1) and the main wiring W2(1). Likewise, an output signal 607b of the main wiring W2(2) is delayed from the input signal 606b thereof by the time period T due to the delay at the driver D2(2) and the main wiring W2(2). An output signal 603 of the clock signal wiring W2(0) is delayed from the input signal 602 thereof by the time period T due to the delays at the driver D2(0) and the wiring W2(0), and is output to the first transfer gates TOUT2(1,j) in each second converter 23(j) as a gate signal.

The reference numeral 608 denotes the gate signals at the transfer gates TOUT2(i,j). The gate signal at the transfer gate TOUT2(k+1,j) (k=1 to n−1, j=1 to m) is delayed from the gate signal at the transfer gate TOUT2(k,j) by the time period T by the delay element DOUT2(k,j). Thus, for the first bus group, for example, the transfer gates TOUT2(i,l) (i=1 to n) are sequentially turned on every time period T, allowing the output signals of the main wiring W2(1) to pass therethrough each for the time period T. The bus input signals VIN2(i,1) of the first bus group which have passed through the transfer gates TIN2(i,l) then pass through the corresponding transfer gates TOUT2(i,1) after the time period T. The flipflops FF(i,1) latch the signals which have passed through the transfer gates TOUT2(i,1) at the falling edge of the respective gate signals, and output as bus output signals VOUT2(i,1) of the first bus group, as shown by the reference numeral 609a in FIG. 7. Likewise, bus output signals VOUT2(i,2) of the second bus group are obtained from the output signals of the main wiring W2(2). Thus, the signals once converted into composite serial signals are restored as the original parallel signals.

When the system clock period for the entire semiconductor integrated circuit of this example is S, the clock signal VCLK2 becomes HIGH for the time period T every period S, and the above-described operation is repeated.

Figure 5:
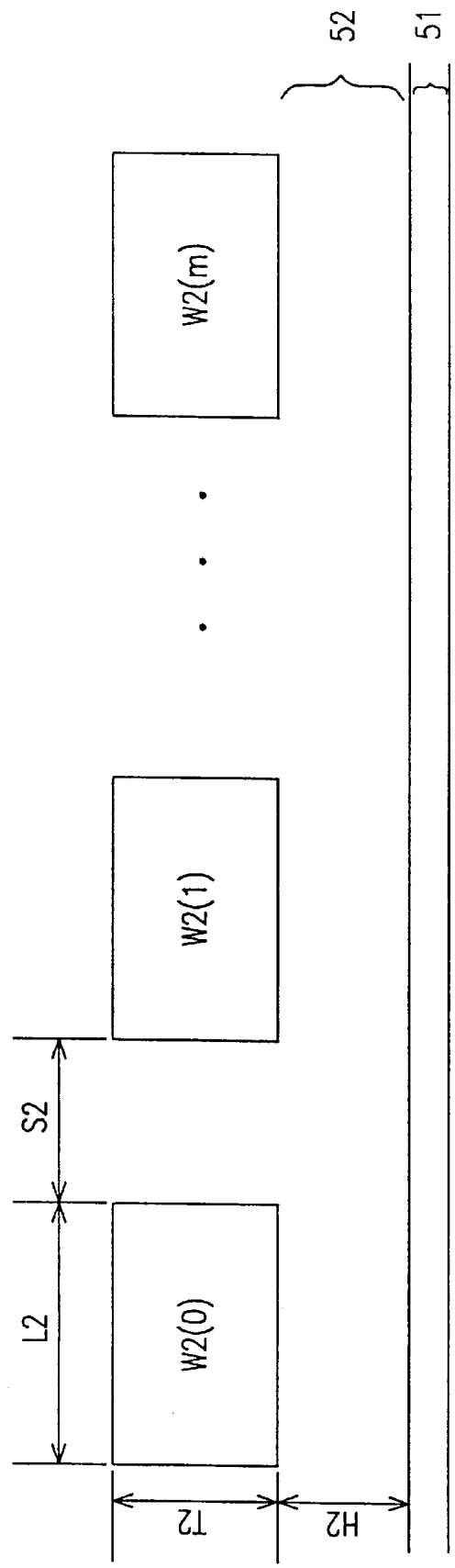
FIG. 5 is a structural sectional view showing a multilayer wiring structure of the semiconductor integrated circuit of Example 2.

FIG. 5 is a structural sectional view taken along line C—C of FIG. 2. Referring to FIG. 5, in Example 2, the size of the m main wirings W2(j) (j=1 to m) for data signal transmission and the clock signal wiring W2(0), i.e., a width L2, a spacing S2, and a thickness T2 of the wirings, and a thickness H2 of an interlayer insulating film 52 separating the wirings W2(0) and W2(j) from a wiring layer 51, can be made larger N/(m+1) times (N=n×m) the size of the bus input/output wiring portions. In comparison with the conventional bus wirings W0(i) shown in FIG. 14 where the size of the wirings is uniform from the input through the output thereof, the wiring resistance of the main wirings W2(j) can be reduced to $(m+1)^2/N^2$ times that of the bus wirings W0(i), while the wiring capacitance of the main wirings W2(j) is kept unchanged. Accordingly, the RC delay at the main wirings W2(j) generated when one signal is sent is $(m+1)^2/N^2$ times that of the bus wirings W0(i). Since n signals are transmitted serially in this example, the total RC delay at the main wirings W2(j) is $(1+n/N)^2/n$ times that of the bus wirings W0(i). Since n/N is less than or equal to 1, the effect of reducing the delay time in this example is greater than that obtained in Example 1.

As in Example 1, the delays other than (1) the wiring RC delay, i.e., (2) the delay required for wiring charging/discharging and (3) the delay at the driver, will be described in comparison with the conventional bus wirings shown in FIG. 14.

As for (2) above, assuming that the total area of the m drivers D2(j) and the driver D2(0) in this example is equal to the total area of the n drivers D0(i) shown in FIG. 14, the gate width of each of the drivers D2(j) can be N/(m+1) times that of each of the drivers D0(i). Accordingly, the delay time required for charging/discharging each of the wirings W2(j) when one signal is sent is (m+1)/N times that required for charging/discharging each of the bus wirings W0(i). Since n signals are transmitted serially in this example, the delay time required for charging/discharging each of the wirings W2(j) is 1+n/N times. However, since n/N is less than or equal to 1, this increase of the delay time required for wiring charging/discharging is less influential on the entire delay time than in the circuit configuration in Example 1.

As for (3) above, the delay time at the drivers D2(j) when one signal is sent is the same as that at the drivers D0(i). When n signals are serially sent as in this example, the delay time at the drivers D2(j) is n times that at the drivers D0(i). However, the delay time at the drivers in this example is relatively reduced to n/N, in comparison with the circuit configuration in Example 1. The circuit configuration in this example is therefore more advantageous than that in Example 1 in this aspect.

The junction capacitances at switches added in parallel are also relatively reduced to n/N, in comparison with the circuit configuration in Example 1. In this aspect, also, the circuit configuration in this example is more advantageous than that in Example 1.

As described above, in Example 2, N (=n×m) buses are grouped into m bus groups, and signals sent in parallel through n buses of each group are converted into composite serial signals passing through one main wiring with a large sectional area (total m main wirings). This makes it possible not only to reduce (1) the wiring RC delay which will otherwise cause a critical problem during the miniaturization of the semiconductor integrated circuit, but also to reduce the increases of (2) the delay required for wiring charging/discharging and (3) the delay at the drivers observed in Example 1.

The delay time generated by the main wirings W2(j), the delay time generated by the clock signal wiring W2(0), the time during which the clock signal VCLK2 is HIGH, the delay time of the delay elements DIN2(k,j) (k=1 to n−1, j=1 to m), and the delay time of the delay elements DOUT2(k,j) are set to be substantially equal. With this setting, the parallel signals can be converted into a composite serial signal and then restored as the parallel signals efficiently.

Figure 13:
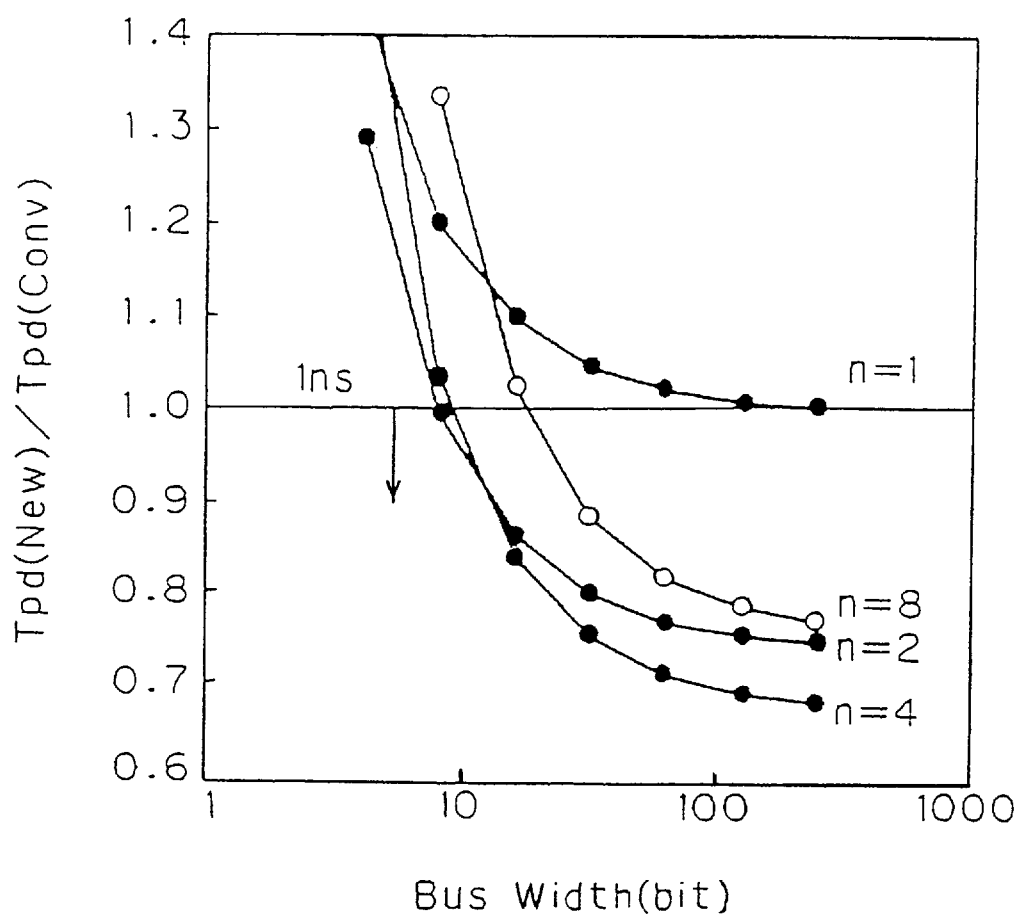
FIG. 13 is a graph illustrating the delay time improvement in the semiconductor integrated circuit of Example 2.

FIG. 13 is a graph illustrating the improvement of the delay time in Example 2. The X and Y axes of this graph represent the bus width and the ratio of the delay time in this example to the delay time in the conventional bus wirings shown in FIG. 14. The reference bus delay time is assumed to be 1 ns, including (1) a wiring RC delay of 0.60 ns, (2) a delay required for wiring charging/discharging of 0.36 ns, and (3) a delay at the driver of 0.04 ns. This delay characteristic corresponds to the generation of the layout design rule in the range of 0.13 to 0.18 μm. As is observed from FIG. 13, as the bus width is larger, the effect of the improvement of the delay time in this example is larger. The number of buses, n, has an optimal value. In this case, the improvement is most effective when n=4.

(EXAMPLE 3)

Figure 8:
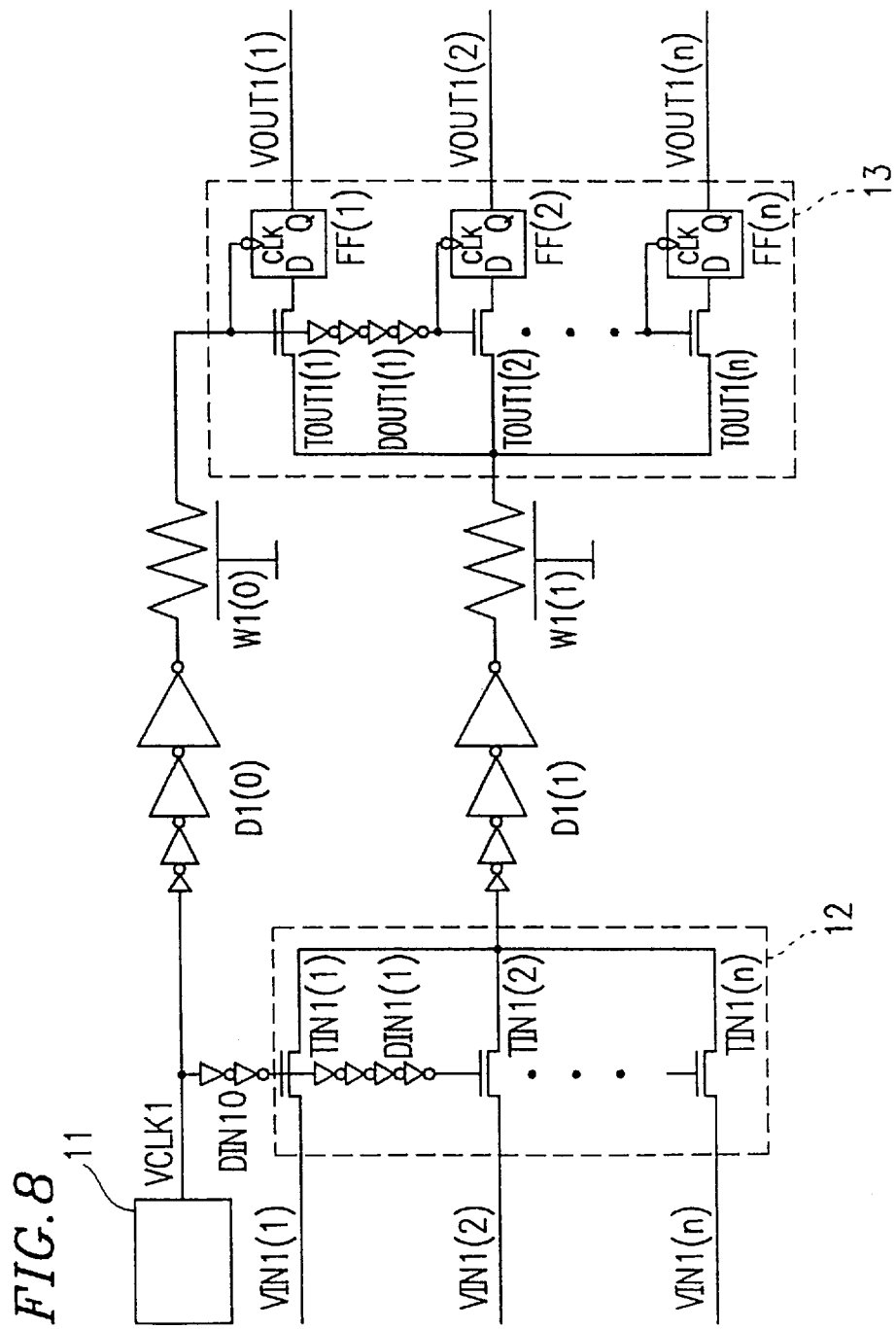
FIG. 8 is a circuit diagram of a semiconductor integrated circuit of Example 3 according to the present invention.

FIG. 8 is a circuit diagram of a semiconductor integrated circuit of Example 3 according to the present invention. The circuit of this example includes one group of n buses as in Example 1. The components having the same functions as those in Example 1 are denoted by the same reference numerals, and the description thereof is omitted.

Referring to FIG. 8, the semiconductor integrated circuit of this example is the same as that of Example 1 except that the clock signal VCLK1 is input into the first transfer gate TIN1(1) in the first converter 12 via a delay element DIN10 as a gate signal. The delay element DIN10 delays a signal for a time t which is shorter than a half of the time period T. The clock signal VCLK1 is therefore input into the first transfer gate TIN1(1) with a delay of the time t.

Figure 9:
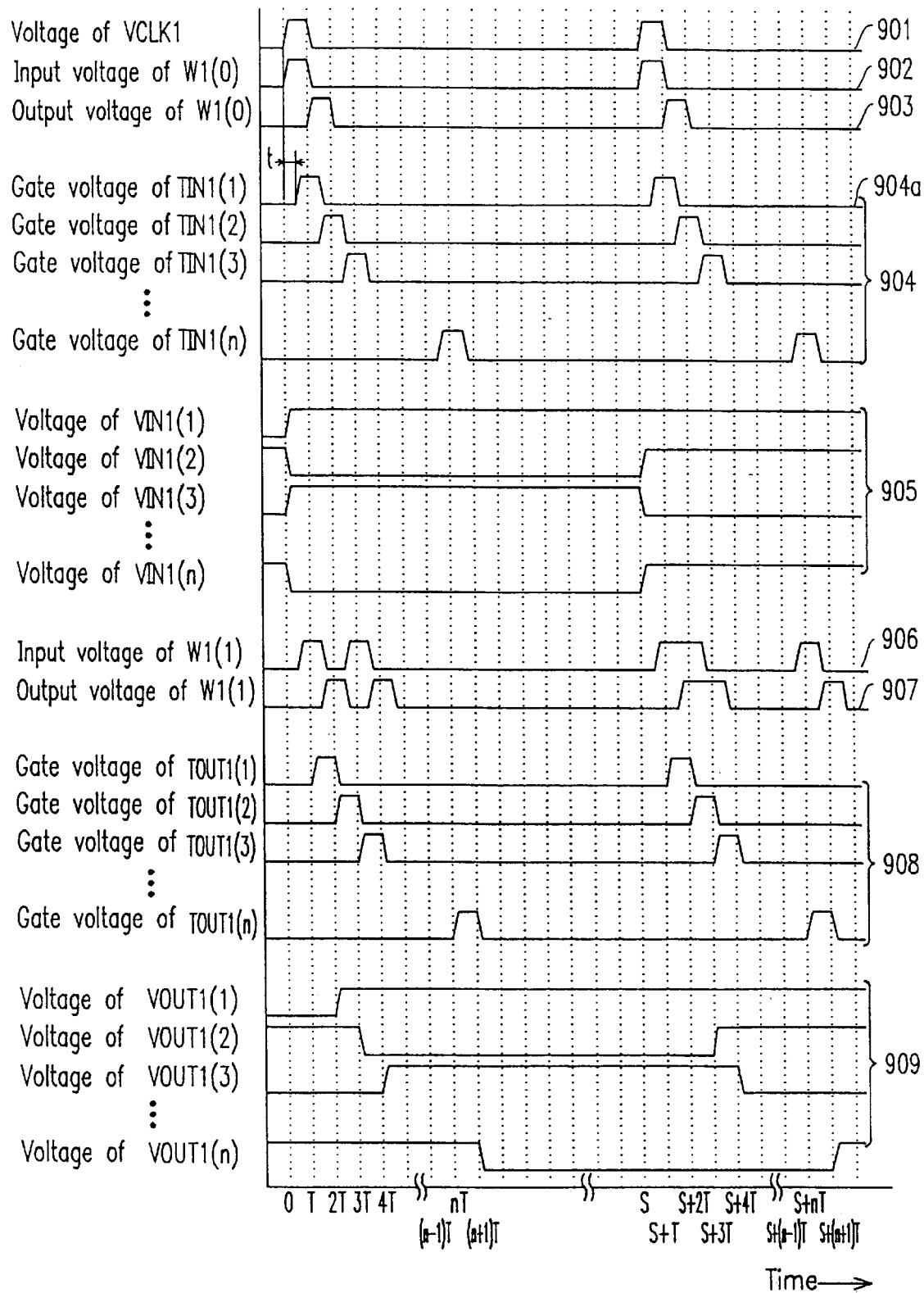
FIG. 9 is a timing diagram of signals used in the semiconductor integrated circuit of Example 3.

The operation of the semiconductor integrated circuit of this example will be described with reference to FIG. 9. FIG. 9 is a timing diagram of signals used in this example. This timing diagram is the same as that in Example 1 shown in FIG. 4 except that gate signals 904 at the transfer gates TIN1(i) (i=1 to n), an input signal 906 of the main wiring W1(1), and an output signal 907 of the main wiring W1(1) are shifted by the time t from those in Example 1.

A gate signal 904a at the first transfer gate TIN1(1) is the clock signal VCLK1 with a delay of the time t as described above. The gate signal at the transfer gate TIN1(j+1) (j=1 to n−1) is delayed from the gate signal at the transfer gate TIN1(j) by the time period T by the delay element DIN1(j). Therefore, the gate signals 904 at the transfer gates TIN1(i) are shifted by the time t from those in Example 1. As in Example 1, the transfer gates TIN1(i) (i=1 to n) are sequentially turned on every time period T, allowing the bus input signals VIN1(i) (905) to pass therethrough each for the time period T. In this example, since the gate signals at the transfer gates TIN1(i) are shifted by the time t, the composite serial signal obtained by coupling together the outputs of the transfer gates TIN1(i) is also shifted by the time t from that in Example 1, as shown as the input signal 906 of the main wiring W1(1). The output signal 907 of the main wiring W1(1) is delayed from the input signal 906 thereof by the time period T due to the delays at the driver D1(1) and the main wiring w1(1).

An output signal 903 of the clock signal wiring W1(0) is delayed from an input signal 902 thereof by the time period T due to the delays at the driver D1(0) and the wiring W1(0), and is input into the first transfer gate TOUT1(1) as a gate signal. The timing of gate signals 908 at the transfer gates TOUT1(i) is the same as that in Example 1. The transfer gates TOUT1(i) (i=1 to n) are sequentially turned on every time period T, allowing the output signals of the main wiring W1(1) to pass therethrough each for the time period T. The flipflops FF(i) latch the signals which have passed through the transfer gates TOUT1(i) at the falling edge of the respective gate signals, and output the bus output signals VOUT1(i) as shown by the reference numeral 909 in FIG. 9. In this example, since the signals sent from the main wiring W1(1) through the transfer gates TOUT1(i) are shifted by the time t, the latching can be performed when the signals have become stable. This reduces misoperation and provides stable operation compared with the case of Example 1. The bus output signals VOUT1(i) (909) have the same timing and waveform as the bus output signals VOUT1 (i) (409) in Example 1. Thus, the signals once converted into composite serial signals are restored as the original parallel signals with stable operation.

When the system reference clock period of the entire semiconductor integrated circuit of this example is S, the clock signal VCLK1 becomes HIGH for the time period T every period S, and the above-described operation is repeated.

Thus, in this example, as in Example 1, the wiring RC delay can be largely reduced, which will otherwise cause a critical problem during the miniaturization of the semiconductor integrated circuit.

(EXAMPLE 4)

Figure 10:
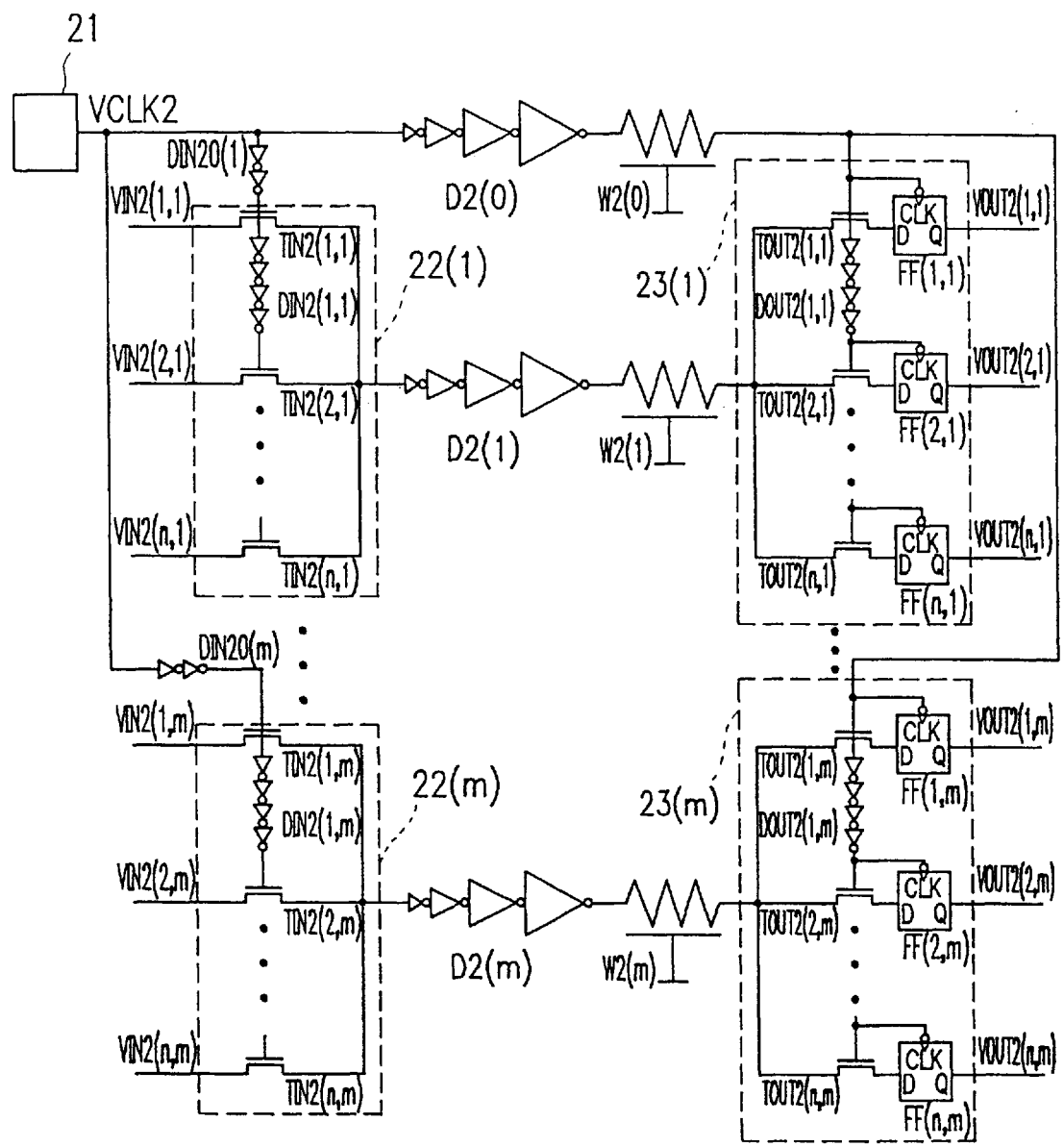
FIG. 10 is a circuit diagram of a semiconductor integrated circuit of Example 4 according to the present invention.

FIG. 10 is a circuit diagram of a semiconductor integrated circuit of Example 4 according to the present invention. As in Example 2, the semiconductor integrated circuit of Example 4 includes m groups each consisting of n buses. The components having the same functions as those in Example 2 are denoted by the same reference numerals, and the description thereof is omitted.

Referring to FIG. 10, the semiconductor integrated circuit of this example is the same as that of Example 2 except that the clock signal VCLK2 is input into the first transfer gate TIN2(1,j) of each bus group via a corresponding delay element DIN20(j) (j=1 to m) as a gate signal. Each of the delay elements DIN20(j) delays a signal for a time t which is shorter than a half of the time period T. Accordingly, the clock signal VCLK2 is input into the first transfer gates TIN2(1,j) with a delay of the time t.

Figure 11:
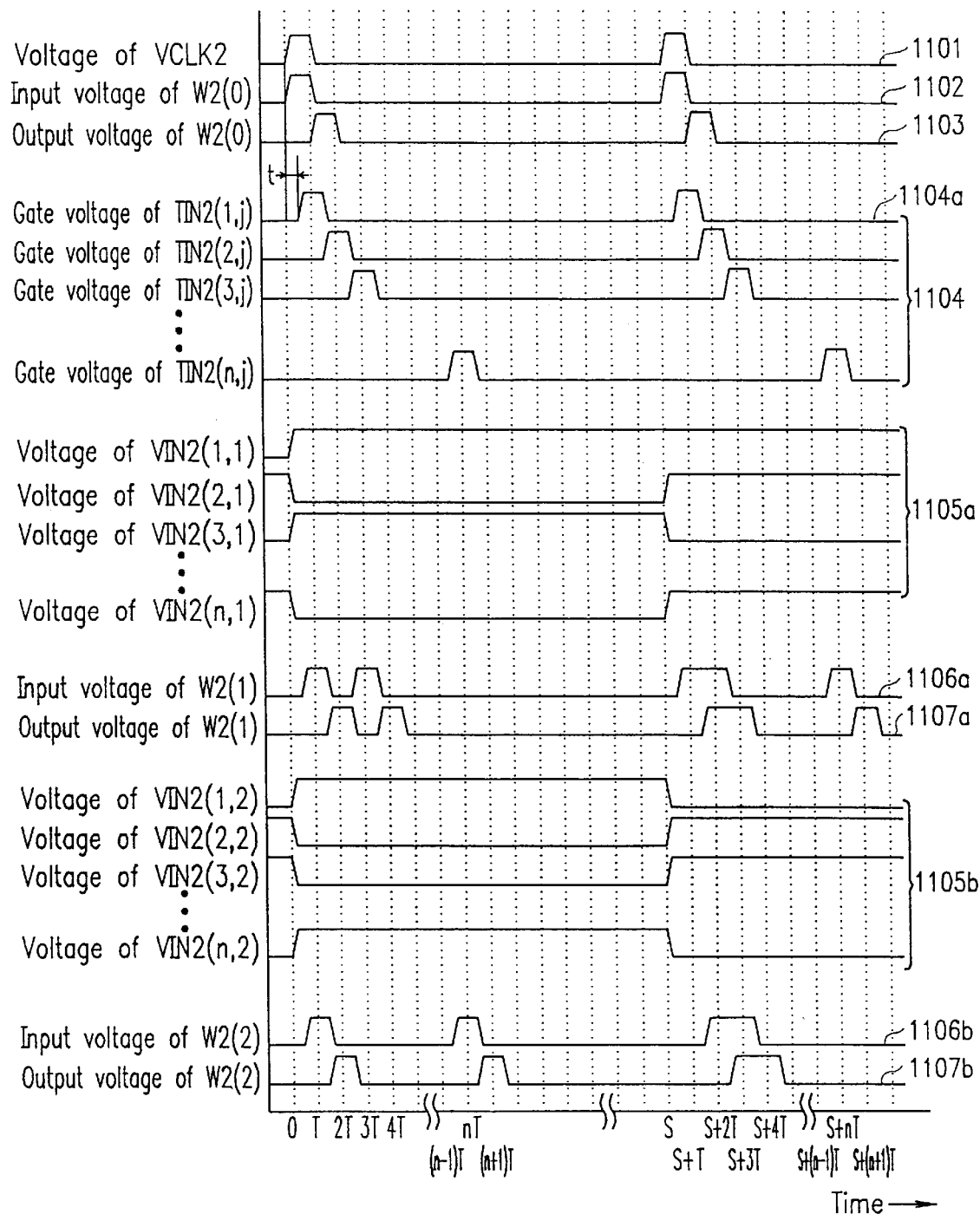
FIG. 11 is a timing diagram of signals used in the semiconductor integrated circuit of Example 4, showing the conversion of parallel signals into a composite serial signal.
Figure 12:
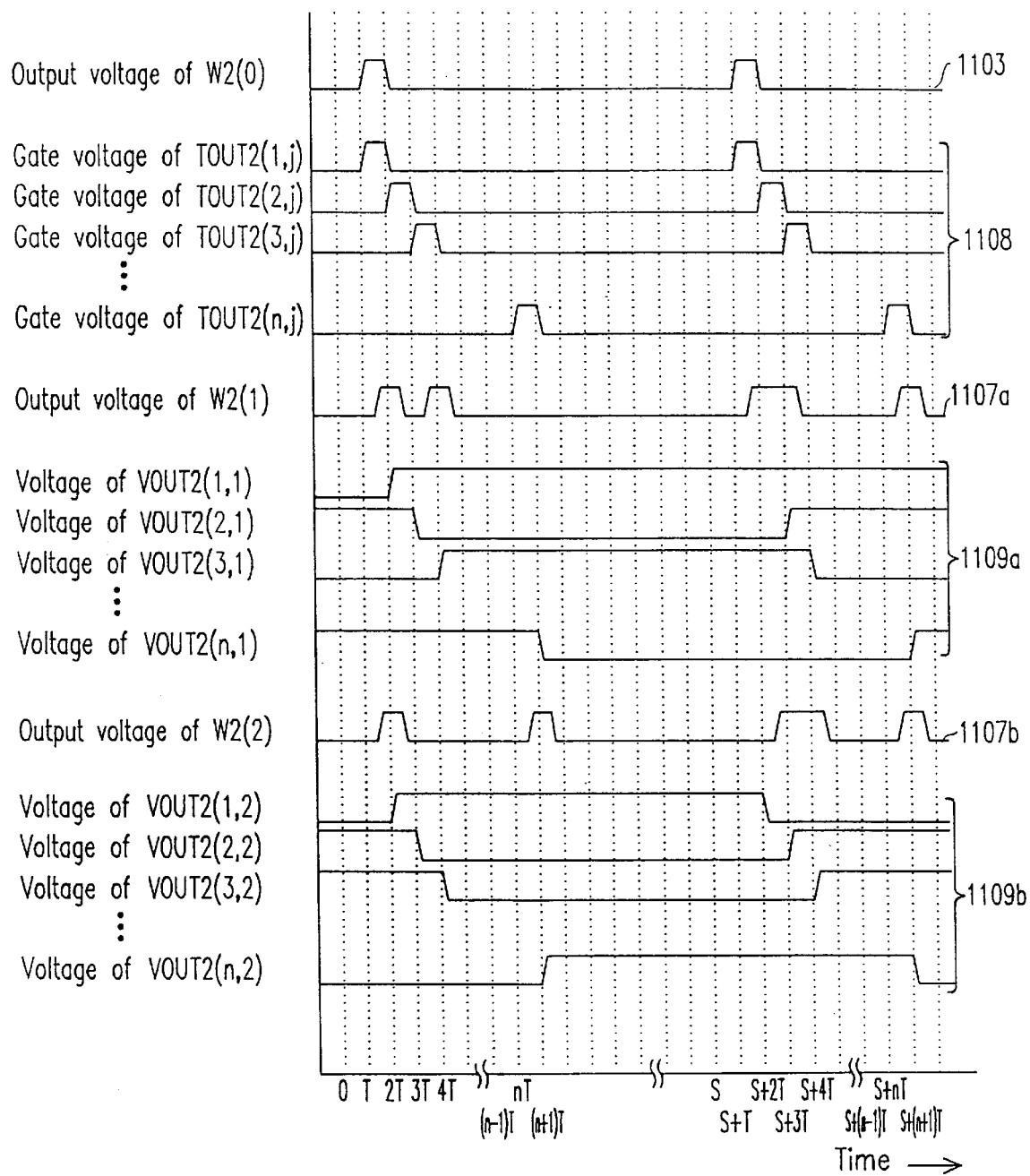
FIG. 12 is a timing diagram of signals used in the semiconductor integrated circuit of Example 4, showing the conversion of the composite serial signal into parallel signals.

The operation of the semiconductor integrated circuit of Example 4 will be described with reference to FIGS. 11 and 12. FIGS. 11 and 12 are timing diagrams of signals used in the semiconductor integrated circuit of this example. Two bus groups from the total m groups are representatively shown in these timing diagrams. These timing diagrams are the same as those in Example 2 shown in FIGS. 6 and 7 except that gate signals 1104 at the transfer gates TIN2(i,j) (i=1 to n, j=1 to m), an input signal 1106a of the main wiring W2(1), an output signal 1107a of the main wiring W2(1), an input signal 1106b of the main wiring W2(2), and an output signal 1107b of the main wiring W2(2) are shifted by the time t from those in Example 2. Since the shifting of the output signals of the main wirings W2(j) by the time t by the provision of the delay elements DIN20(j) is the same as that described in Example 3, detailed description thereof is omitted here.

The timing of gate signals 1108 at the transfer gates TOUT2(i,j) are the same as that in Example 2. For the first bus group, for example, the transfer gates TOUT2(i,1) (i=1 to n) are sequentially turned on every time period T, allowing the output signals of the main wiring W2(1) to pass therethrough each for the time period T. The flipflops FF(i,1) latch the signals which have passed through the transfer gates TOUT2(i,1) at the falling edge of the respective gate signals, and output as the bus output signals VOUT2(i,1) of the first group, as shown by the reference numeral 1109a in FIG. 12. In this example, since the signals sent from the main wiring W2(1) through the transfer gates TOUT2(i,1) are shifted by the time t, the latching can be performed when the signals have become stable. This reduces misoperation and provides stable operation compared with the case of Example 2. The bus output signals VOUT2(i,1) (1109a) have the same timing and waveform as the bus output signals VOUT2(i,1) (609a) in Example 2. Thus, the signals once converted into a composite serial signal are restored as the original parallel signals with stable operation.

When the system reference clock period of the entire semiconductor integrated circuit of this example is S, the clock signal VCLK2 becomes HIGH for the time period T every period S, and the above-described operation is repeated.

Thus, in this example, as in Example 2, the wiring RC delay can be largely reduced, which will otherwise cause a critical problem during the miniaturization of a semiconductor integrated circuit.

In Examples 1 to 4 above, the main wirings or the clock signal wiring may be formed in the same layer or a different layer than the bus input/output wirings.

For the synchronization of the entire semiconductor integrated circuit, the clock signal supply section 11 or 21 may generate the clock signal based on a system clock signal, or the entire system may be synchronized based on the clock signal generated by the clock signal supply section 11 or 21.

In the above examples, a set of bus signals were sent through one main wiring. The effect of the present invention can also be obtained in the case of sending independent signals having no relation with each other.

In Examples 2 and 4, the circuit configuration of m bus groups each consisting of n buses was described. The numbers of buses in all the groups are not necessarily the same, but may be different from one another.

Thus, according to the present invention, signals sent in parallel through a plurality of buses are serially sent through one main wiring with a large sectional area. This reduces the wiring resistance and thereby largely reduces the wiring RC delay.

The delay time generated by the main wiring, the delay time generated by the clock signal wiring, the time during which the clock signal is HIGH, the delay time generated by the delay elements on the input side, and the delay time generated by the delay elements on the output side are set to be substantially equal. With this setting, the parallel signals can be converted into a composite serial signal and then restored as the parallel signals efficiently.

N (=n×m) buses are grouped into m bus groups, and signals sent in parallel through n buses in each group are serially transmitted through one main wiring with a large sectional area (total m main wirings). This reduces the wiring resistance and thereby further reduces the wiring RC delay.

As a result, a semiconductor integrated circuit capable of reducing the interconnect delay in a process under the design rule of deep submicrons to realize higher integration and high speed operation can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit comprising:

a first converter for converting a plurality of input data signals into a composite serial data signal and outputting the composite serial data signal;

a second converter for receiving the composite serial data signal via a data signal wiring and converting the composite serial data signal into a plurality of output data signals; and a clock signal supply section for supplying a clock signal for synchronizing an operation of the first converter and an operation of the second converter, wherein the clock signal is input into the first converter and the second converter via a clock signal wiring, the data signal wiring imparts a time delay to the composite serial data signal input into the second converter, the clock signal wiring imparts a time delay to the clock signal input into the second converter, and the wiring dimensions for the data signal wiring and clock signal wiring being larger than the wiring dimensions for the input data signals.

2. A semiconductor integrated circuit according to claim 1, wherein the first converter comprises:

first to n-th input transfer gates each for receiving one of the plurality of input data signals, for allowing the input data signal to pass therethrough for a predetermined period based on a gate signal, and for outputting a transmitted input data signal; and a plurality of input delay elements each operatively coupled to a corresponding one of the plurality of input transfer gates for delaying for a predetermined time period the gate signal input into each of the input transfer gates, wherein the clock signal is input into the first input transfer gate as the gate signal, and the gate signal at the i-th (i=1 to n−1) input transfer gate is input into the (i+1)th input transfer gate via one of the plurality of input delay elements as the gate signal, and the second converter comprises:

first to n-th output transfer gates each for receiving the composite serial data signal, for allowing the composite serial data signal to pass therethrough for a predetermined period based on the gate signal, and for outputting a transmitted output data signal; and a plurality of output delay elements each operatively coupled to a corresponding one of the plurality of output transfer gates for delaying for a predetermined time period the gate signal input into each of the output transfer gates, wherein the clock signal is input into the first output transfer gate as the gate signal, and the gate signal at the i-th (i=1 to n−1) output transfer gate is input into the (i+1)th output transfer gate via one of the plurality of output delay elements as the gate signal.

3. A semiconductor integrated circuit according to claim 2, wherein the delay time of each of the plurality of input delay elements and the delay time of each of the plurality of output delay elements corresponding to each of the plurality of input delay elements are substantially equal.

4. A semiconductor integrated circuit according to claim 2, wherein a delay time generated by the data signal wiring and a delay time generated by the clock signal wiring are substantially equal.

5. A semiconductor integrated circuit according to claim 2, wherein the delay time of each of the plurality of input delay elements, the delay time of each of the plurality of output delay elements corresponding to each of the plurality of input delay elements, a delay time generated by the data signal wiring, and a delay time generated by the clock signal wiring are substantially equal.

6. A semiconductor integrated circuit according to claim 1, wherein the number of the plurality of input data signals is n (wherein n is a natural number of two or more), and a wiring width and a wiring spacing for the data signal wiring and the clock signal wiring are n/2 times a wiring width and a wiring spacing for input data wiring carrying the input data signals.

7. A semiconductor integrated circuit according to claim 1, wherein the number of the plurality of input data signals is n (wherein n is a natural number of two or more), the data signal wiring and the clock signal wiring overlie an interlayer film which overlies another wiring layer, and a wiring width, a wiring spacing, a wiring thickness, and an interlayer film thickness for the data signal wiring and the clock signal wiring are n/2 times a wiring width, a wiring spacing, a wiring thickness, and an interlayer film thickness for input data wiring carrying the input data signals.

8. A semiconductor integrated circuit comprising:

a plurality of first converters;

a plurality of second converters; and a clock signal supply section for supplying a clock signal for synchronizing an operation of the plurality of first converters and an operation of the plurality of second converters, wherein each of the plurality of first converters converts a plurality of input data signals into a composite serial data signal and outputs the composite serial data signal, each of the plurality of second converters receives the composite serial data signal via a data signal wiring and converts the composite serial data signal into a plurality of output data signals, the clock signal is input into each of the plurality of first converters and the plurality of second converters via a clock signal wiring, each of the data signal wirings imparts a time delay to the composite serial data signal input into each of the plurality of second converters, the clock signal wiring imparts a time delay to the clock signal input into each of the plurality of second converters, and the wiring dimensions for the data signal wiring and clock signal wiring being larger than the wiring dimensions for the input data signals.

9. A semiconductor integrated circuit according to claim 8, wherein each of the plurality of first converters comprises:

first to n-th input transfer gates each for receiving one of the plurality of input data signals, for allowing the input data signal to pass therethrough for a predetermined period based on a gate signal, and for outputting a transmitted input data signal; and a plurality of input delay elements each operatively coupled to a corresponding one of the plurality of input transfer gates for delaying for a predetermined time period the gate signal input into each of the input transfer gates, wherein the clock signal is input into the first input transfer gate as the gate signal, and the gate signal at the i-th (i=1 to n−1) input transfer gate is input into the (i+1)th input transfer gate via one of the plurality of input delay elements as the gate signal, and each of the plurality of second converters comprises:

first to n-th output transfer gates each for receiving the composite serial data signal, for allowing the composite serial data signal to pass therethrough for a predetermined period based on the gate signal, and for outputting a transmitted output data signal; and a plurality of output delay elements each operatively coupled to a corresponding one of the plurality of output transfer gates for delaying for a predetermined time period the gate signal input into each of the output transfer gate, wherein the clock signal is input into the first output transfer gate as the gate signal, and the gate signal at the i-th (i=1 to n−1) output transfer gate is input into the (i+1)th output transfer gate via one of the plurality of output delay elements as the gate signal.

10. A semiconductor integrated circuit according to claim 9, wherein the delay time of each of the plurality of input delay elements and the delay time of each of the plurality of output delay elements corresponding to each of the plurality of input delay elements are substantially equal.

11. A semiconductor integrated circuit according to claim 9, wherein a delay time generated by each of the data signal wirings and a delay time generated by the clock signal wiring are substantially equal.

12. A semiconductor integrated circuit according to claim 9, wherein the delay time of each of the plurality of input delay elements, the delay time of each of the plurality of output delay elements corresponding to each of the plurality of input delay elements, a delay time generated by each of the data signal wirings, and a delay time generated by the clock signal wiring are substantially equal.

13. A semiconductor integrated circuit according to claim 8, wherein the number of the plurality of input data signals is n×m (wherein n and m are natural numbers of two or more, wherein m represents the number of first and second converters and wherein n represents the number of input data signals input to each of the plurality of first converters), and a wiring width and a wiring spacing for the data signal wirings and the clock signal wiring are (n×m)/(m+1) times a wiring width and a wiring spacing for input data wiring carrying the input data signals.

14. A semiconductor integrated circuit according to claim 8, wherein the number of the plurality of input data signals is n×m (wherein n and m are natural numbers of two or more, wherein m represents the number of first and second converters and wherein n represents the number of input data signals input to each of the plurality of first converters), the data signal wiring and the clock signal wiring overlie an interlayer film which overlies another wiring layer, and a wiring width, a wiring spacing, a wiring thickness, and an interlayer film thickness for the data signal wirings and the clock signal wiring are (n×m)/(m+1) times a wiring width, a wiring spacing, a wiring thickness, and an interlayer film thickness for input data wiring carrying the input data signals.

* * * * *